United States Patent
Lu et al.

(10) Patent No.: US 6,800,566 B2
(45) Date of Patent: Oct. 5, 2004

(54) ADJUSTMENT OF N AND K VALUES IN A DARC FILM

(75) Inventors: Zhi-Cherng Lu, Taipei (TW); Chi-Chun Chen, Kaohsiung (TW); Chang Weng, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 185 days.

(21) Appl. No.: 10/081,985

(22) Filed: Feb. 21, 2002

(65) Prior Publication Data

US 2003/0211755 A1 Nov. 13, 2003

(51) Int. Cl.[7] ............................................. H01L 21/30
(52) U.S. Cl. ...................... 438/761; 427/569; 427/579
(58) Field of Search ................................ 438/710, 758, 438/761, 763, 778; 427/457, 532, 533, 535, 569, 578, 579

(56) References Cited

U.S. PATENT DOCUMENTS

| 6,037,276 | A | * | 3/2000 | Lin et al. | 438/786 |
|---|---|---|---|---|---|
| 6,060,132 | A | | 5/2000 | Lee | 427/579 |
| 6,063,704 | A | | 5/2000 | Demirlioglu | 438/664 |
| 6,228,700 | B1 | | 5/2001 | Lee | 438/238 |
| 6,242,361 | B1 | * | 6/2001 | Lee et al. | 438/710 |
| 6,291,363 | B1 | | 9/2001 | Yin et al. | 438/769 |
| 6,376,392 | B1 | * | 4/2002 | Lee et al. | 438/778 |
| 6,479,401 | B1 | * | 11/2002 | Linliu et al. | 438/763 |

* cited by examiner

Primary Examiner—Evan Pert
(74) Attorney, Agent, or Firm—George O. Saile; Stephen B. Ackerman

(57) ABSTRACT

CVD dielectric materials are generally preferred for anti-reflection coatings because their optical properties can be varied both by controlling composition and by suitable surface treatment. In prior art films of this type it can be difficult to control both the refractive index and the extinction coefficient simultaneously. The present invention shows how optical properties can be tailored to meet a range of predetermined values by depositing each dielectric anti-reflection coating as a series of sub-coatings. After each sub-coating has been deposited it is subjected to surface treatment through exposure to a gaseous plasma, thereby forming an interface layer which provides a wider window for fine tuning RI and K values. Generally the finished film will comprise 3–of these sub-coatings. Software simulation is used to determine the precise composition for each sub-layer as well as the optical properties of the DARC film. In-situ or off-line measurements of each sub-layer can also be used as a feedback tool to guide conditions for deposition of the next sub-layer.

22 Claims, 3 Drawing Sheets

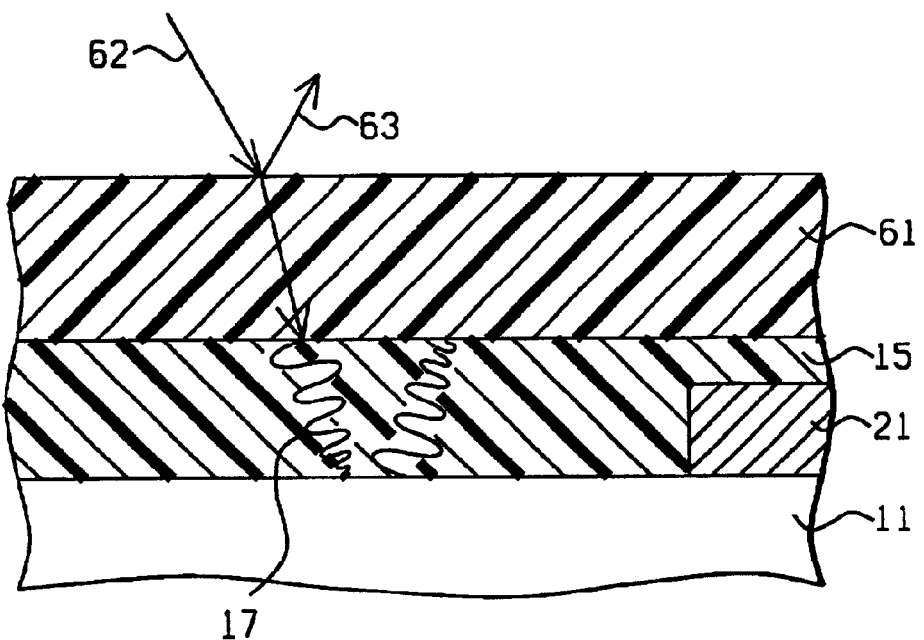
FIG. 1 – Prior Art
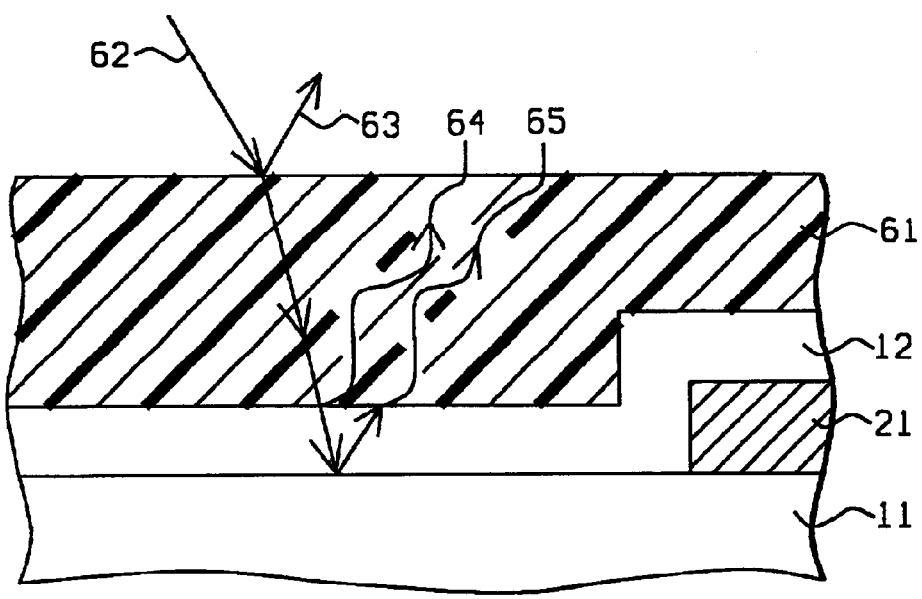
FIG. 2 – Prior Art

ADJUSTMENT OF N AND K VALUES IN A DARC FILM

FIELD OF THE INVENTION

The invention relates to the general field of optical lithography with particular reference to anti-reflection coatings.

BACKGROUND OF THE INVENTION

As the feature size of semiconductor devices decreases, critical dimension (CD) control becomes an important task. The "swing effect" (line width variation due to wafer surface topography and resist thickness variation) needs to be minimized during lithograph processes. There are at least two ways to reduce this undesired swing effect.

1. A bottom anti-reflective coating (BARC), applied at the interface between the photoresist and the highly reflective substrate, has been very effective in reducing line width varaitions. A popular BARC method is to spin coat a relatively thick organic film to absorb light reflected from the substrate. This is illustrated in FIG. 1 where organic BARC 15 has been inserted between the upper surface of substrate 11 and photoresist layer 61. Incoming light ray 62 is partially reflected as 63 while the rest continues into BARC 15 as ray 17 which is rapidly absorbed by 15 so that the amount of reflected light 18, from the surface of 11, is greatly reduced. Also, as fringe benefit, organic ARCs have a planarizing effect, as shown by the non-conformal coverage of step 21 (typically a metallic line).

2. Use of chemical vapor deposition (CVD) deposited dielectric anti-reflective coating (DARC) layers. At present, DARC layer deposition by CVD is one of the major approaches for deep ultraviolet (DUV) lithography. The primary advantage of a CVD-deposited dielectric film is that its optical properties are directly related to its film stochiometry composition (such as Si, O, N, C ) which can be precisely tuned by adjusting the CVD process parameters: gas ratio, pressure, power, spacing ... etc. This is illustrated in FIG. 2 where incoming light ray 62, after traversing photoresist layer 61, is reflected from both the top and bottom surfaces of DARC 12 as rays 64 and 65, respectively. Through control of the refractive index and thickness of DARC 12, rays 64 and 65 can be set to be 180° out of phase so that destructive interference occurs and no light gets reflected from the bottom surface of the photoresist.

The present invention offer a key advantage—improved control of RI and K for the same DARC thickness.

A routine search of the prior art was performed with the following references of interest being found:

In U.S. Pat. No. 6,291,363 B1, Yin et al. show an ammonia based treatment of a dielectric anti-reflective coating (DARC) layer to minimize formation of defects therein. U.S. Pat. No. 6,228,760 B1 (Lee et al.) shows a SION or SIOX DARC layer process while in U.S. Pat. No. 6,063,704 Demirliogiu discloses a silicon oxynitride dielectric anti-reflective coating layer process wherein a DARC is given added silicon so that it can be used in a SALICIDE process. In U.S. Pat. No. 6,060,132, Lee discloses a chemical vapor deposition dielectric anti reflective coating layer process and uses a plasma treatment to remove contamination by a resist.

SUMMARY OF THE INVENTION

It has been an object of at least one embodiment of the present invention to provide a dielectric anti-reflection coating having predetermined optical properties.

Another object of at least one embodiment of the present invention has been that said optical properties include refractive index and extinction coefficient.

Still another object of at least one embodiment of the present invention has been to provide a process for manufacturing said coating.

A further object of at least one embodiment of the present invention has been to provide means for controlling said process in order to obtain optimum results.

These objects have been achieved by depositing said dielectric anti-reflection coating as a series of sub-coatings. After each sub-coating has been deposited it is subjected to surface treatment through exposure to a gaseous plasma. Generally the finished film will comprise 3–5 of these sub-coatings. Software simulation is used to determine the precise composition of each sub-layer as well as its optical properties. In-situ or off-line measurement of each sub-layer can also be used as a tool to guide conditions for deposition of the next sub-layer.

BRIEF DESCRIPTION OF THE DRAWINGS

FIG. 1 shows a bottom anti-reflection coating (BARC) based on absorption of reflected light.

FIG. 2 shows an anti-reflection coating based on destructive interference between reflected light rays.

DESCRIPTION OF THE PREFERRED EMBODIMENTS

We have summarized in TABLE I below the effect of plasma treatment on RI and K after the full desired DARC thickness has been deposited. It is to be noted that, once the full thickness has been laid down, subsequent plasma treatment has little influence on T, RI, and K values. For this example, the DARC was about 1,200 Å thick.

TABLE I

| TREATMENT | T(Å)/NU(%) | RI/NU(%) | K/NU(%) |
|---|---|---|---|
| as deposited | 1177/0.9 | 1.989/0.226 | 0.443/2.205 |
| N$_2$O plasma | 1170/0.91 | 1.971/0.505 | 0.446/5.07 |
| He plasma | 1171/0.89 | 1.987/0.245 | 0.448/3.86 | where T=Thickness, NU=non-uniformity, RI=refractive index, K=extinction coefficient Confirmation that plasma treatment of interface layers can change a DARC film's optical properties is presented in TABLE II below. As can be seen, for the DARC film with N$_2$O plasma treatment, not only has RI been reduced but (unlike the thick film example of TABLE I) K has also been reduced (possibly due to surface oxidation). TABLE II shows that plasma treatment of individual layers that make up a DARC film can alter its optical properties.

TABLE II

| TREATMENT | T(Å)/NU(%) | RI/NU(%) | K/NU(%) |
|---|---|---|---|
| as deposited | 307/1.09 | 1.853/2.04 | 0.6757/3.12 |
| N$_2$O plasma | 302/1.10 | 1.772/1.86 | 0.6487/3.21 | where T=thickness, NU=nonuniformity, RI=refractive index, K=extinction coefficient In this invention, therefore, we describe a method to adjust RI and K values through multilayer interfacial engineering. The disclosed anti-reflection layer is composed of multilayers deposited by a multi-stage PE (plasma enhanced) CVD process. Each stage deposits part of the final desired thickness. By proper plasma surface treatment to alter the DARC film interface concentration, the DARC film's optical properties can be fine tuned not only through control of composition but also by the plasma treated interface.

This new DARC film process provides a much wider margin for the refractive index and extinction coefficient making it well suited to meet different process application requirements. Although we have focused on silicon oxynitride films prepared by PECVD, followed by exposure to a nitrous oxide plasma, the method is more general and could be applied to other dielectrics (such as SiOC or SiO,) as well as to other plasma surface treatments.

Figure 3:
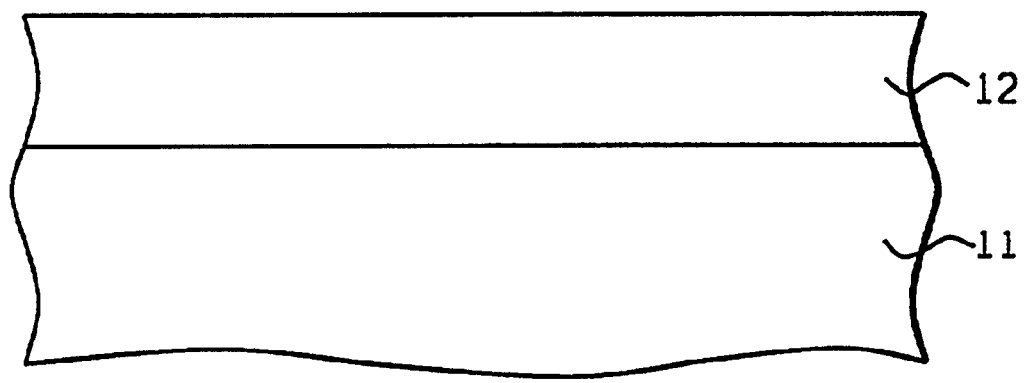
FIG. 3 shows the starting point for the process of the present invention.

We now provide a detailed description of the process of the present invention. In the course of so doing, the structure of the present invention will also become apparent. We refer now to FIG. 3 where we show a substrate 11 on which has been deposited dielectric layer 12. Most commonly, though not necessarily, said substrate will be a silicon wafer containing a number of unfinished integrated circuits. As noted earlier, layer 12 would most likely be silicon oxynitride deposited by PECVD but the process could be applied to any film and method in which refractive index and composition are a function of the deposition conditions.

Figure 4:
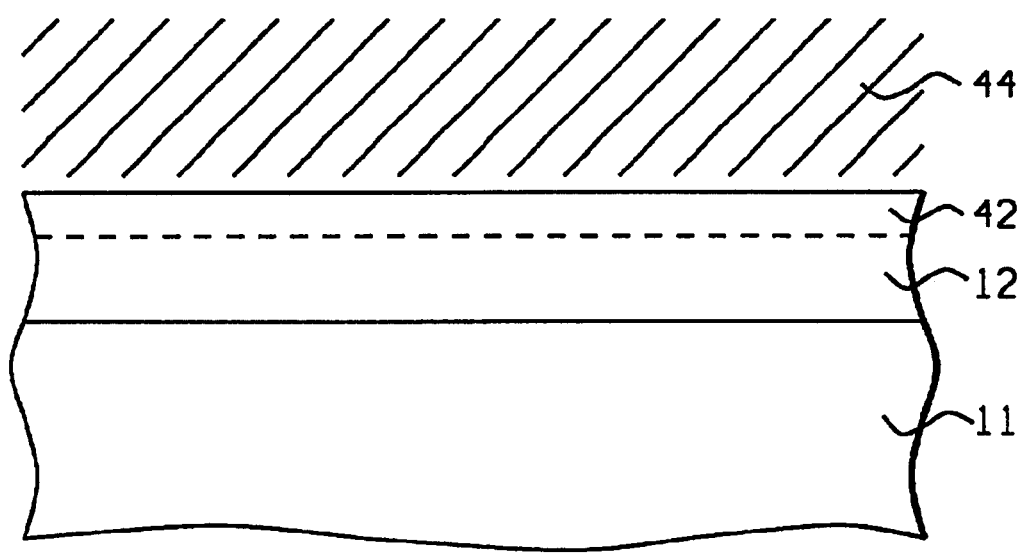
FIG. 4 hows a dielectric layer being exposed to a gaseous plasma.
Figure 5:
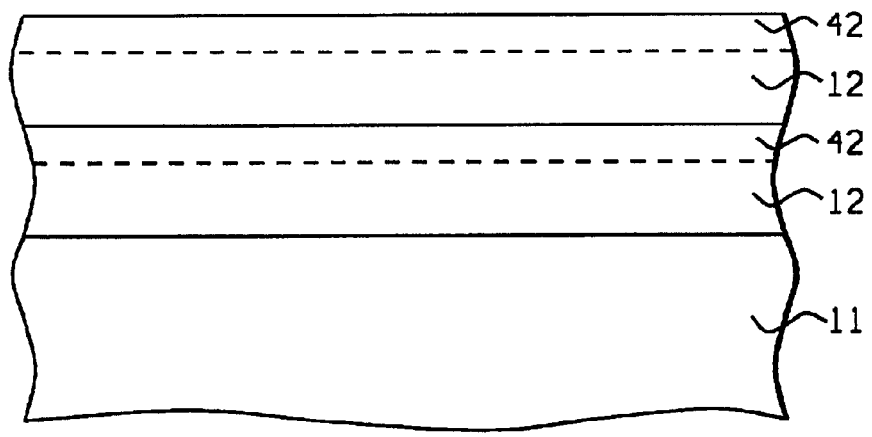
FIG. 5 shows a partially completed version of the present invention.
Figure 6:
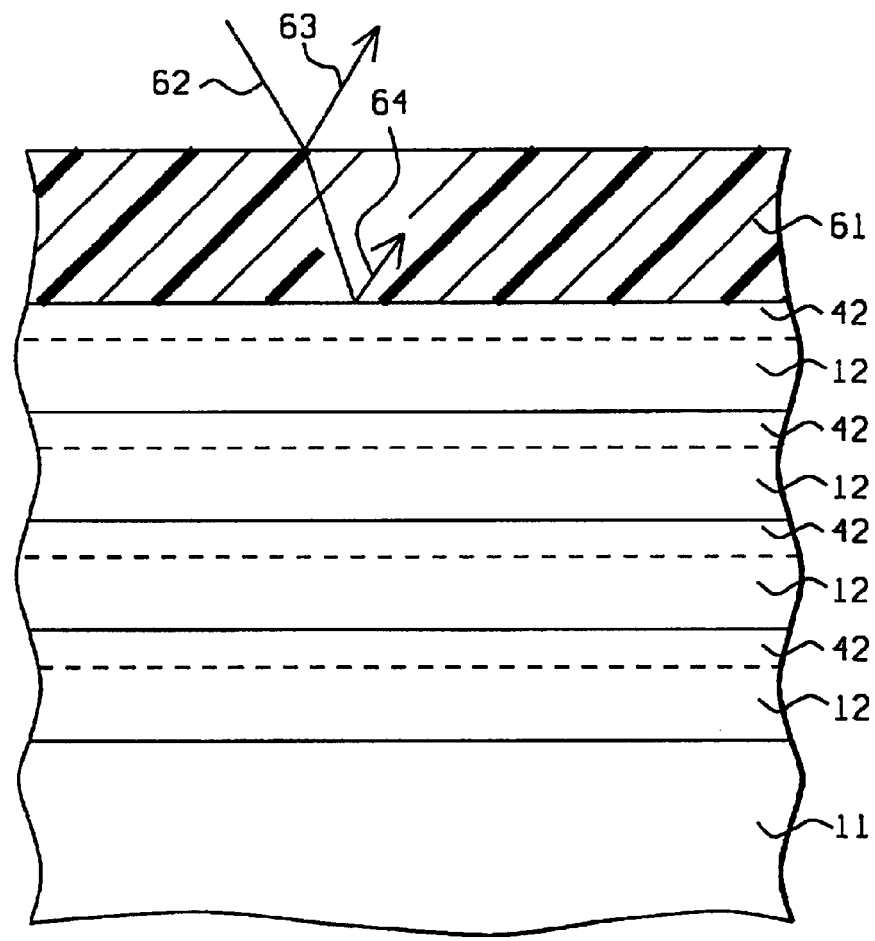
FIG. 6 shows the end product of the process of the present invention wherein reflected light is canceled by destructive interference.

A key feature of the process is that layer 12 is not as thick as the final DARC is required to be, being at most half the intended final thickness. As shown in FIG. 4, layer 12 is now exposed to gas plasma 44, typically for between about 5 and 20 seconds, with about 15 seconds being preferred, resulting in the formation of modified surface layer 42. Depending on the thickness of layer 12, the process is then repeated multiple times until the intended final thickness of the DARC has been arrived at. The number of layers may vary but is typically between about 2 and 5, with 4 being preferred. The final thickness is between about 500 and 2,000 Angstroms with about 11000 Å being preferred. In FIG. 5 we show the structure after two deposition cycles while FIG. 6 illustrates the final structure, which in this example contained four layers, as well as photoresist layer 61.

Our preferred plasma treatment has been to introduce a mixture of nitrous oxide and oxygen, with the former being present at about 85 volume %, and to then use RF at a power level between about 500 and 1,500 watts to excite a plasma. Other possible plasma gas components include nitrogen, argon and helium.

In order to be able to exercise maximum control of the optical properties of the final layer, the process of the present invention also includes two additional features:

(1) Prior to deposition of any layers, we determine, through software simulation, the optimum composition, thickness, and surface treatment for each layer that is to be deposited, thereby ensuring that the final DARC has the desired optical properties.

(2) As a stack of layers is built up, after each individual layer has been formed and been given a surface treatment, the refractive index and extinction coefficient values for the stack is determined (by insitu or off-line measurement). The values so obtained are then used for adjusting conditions during subsequent steps so that achievement of the desired properties in the final stack is assured.

Note that the above two features are not mutually exclusive. Thus a mix of measurements and simulation may be used, with each potentiating the other.

CONFIRMATORY RESULTS

In TABLE III below we summarize the optical properties of two DARCs made according to the process of the present invention—one comprising 3 layers and one comprising 4 layers.

TABLE III

| TREATMENT | no. of layers | T(Å)/NU(%) | RI/NU(%) | K/NU(%) |
|---|---|---|---|---|
| none | 3 | 867/0.86 | 1.990/0.18 | 0.410/1.30 |
| N$_2$O plasma | 3 | 872/0.76 | 1.924/0.22 | 0.372/2.30 |
| none | 4 | 1146/0.87 | 1.983/0.30 | 0.4314/3.235 |
| N$_2$O plasma | 4 | 1152/0.78 | 1.936/1.85 | 0.3713/4.638 | where T=thickness, NU=non-uniformity, RI=refractive index, K=extinction coefficient TABLE III confirms that plasma treatment of individual layers that together make up a DARC film really does alter said DARC film's optical properties.

What is claimed is:

1. A process for forming a dielectric anti-reflection coating, having a final thickness, comprising the steps of:
   (a) depositing a dielectric layer having a thickness that is at most half said final thickness;
   (b) then exposing said dielectric layer of step (a) to a gaseous plasma for a period of time; and
   repeating steps (a) and (b), with no intervening layers, until a total layer thickness equal to said final thickness has been achieved.

2. The process described in claim 1 wherein said gaseous plasma is nitrous oxide gas.

3. The process described in claim 1 wherein said gaseous plasma is selected from the group consisting of helium, argon, ammonia, oxygen, and nitrogen.

4. The process described in claim 1 wherein each of said dielectric layers is selected from the group consisting of silicon oxynitride and silicon oxycarbide.

5. The process described in claim 1 wherein steps (a) and (b) are repeated between 2 and 5 times.

6. The process described in claim 1 wherein said final thickness is between about 500 and 2,000 Angstroms.

7. The process described in claim 1 wherein said period of time is between about 5 and 20 seconds.

8. A process for forming a dielectric anti-reflection coating, having a predetermined refractive index, extinction coefficient and final thickness, comprising:

through simulation, determining composition, thickness, and the effects of surface treatment for each of a number of layers of said dielectric whereby said number of layers have a total thickness equal to said final thickness and a structure formed of said number of layers has said predetermined refractive index and extinction coefficient; then (a) depositing a layer of dielectric material having the thickness and composition determined through said simulation;

(b) then exposing said layer of dielectric material of step (a) to the surface treatment determined through said simulation; and repeating steps (a) and (b), with no intervening layers, until said number of layers has been deposited.

9. The process described in claim 8 wherein each of said dielectric layers is selected from the group consisting of silicon oxynitride and silicon oxycarbide.

10. The process described in claim 8 wherein said surface treatment is exposure to a plasma selected from the group consisting of nitrous oxide, helium, argon, oxygen, and nitrogen.

11. The process described in claim 10 wherein said period of time is between about 5 and 20 seconds.

12. The process described in claim 8 wherein said number of layers is between 2 and 5.

13. The process described in claim 8 wherein said final thickness is between about 500 and 2,000 Angstroms.

14. The process described in claim 8 wherein step (b) further comprises measuring refractive index and extinction coefficient and then using said measurements to modify said thickness, composition, and surface treatment conditions during subsequent repetitions of steps (a) and (b).

15. A process for forming a dielectric anti-reflection coating, having a predetermined refractive index, extinction coefficient and final thickness, comprising the steps of:

(a) depositing a dielectric layer having a thickness that is at most half said final thickness;

(b) then exposing said dielectric layer of step (a) to a gaseous plasma for a period of time;

repeating steps (a) and (b), with no intervening layers, thereby forming a stack of layers, until a total layer thickness equal to said final thickness has been achieved;

after each stack has been formed, determining refractive index and extinction coefficient values for that stack; and based on said determined values, adjusting conditions during subsequent steps whereby, after said final thickness has been achieved, a final stack having said pre-determined refractive index and extinction coefficient is formed.

16. The process described in claim 15 wherein each of said dielectric layers is selected from the group consisting of silicon oxynitride and silicon oxycarbide.

17. The process described in claim 15 wherein said gaseous plasma is nitrous oxide gas.

18. The process described in claim 15 wherein said gaseous plasma is selected from the group consisting of helium, argon, ammonia, oxygen, and nitrogen.

19. The process described in claim 15 wherein steps (a) and (b) are repeated between 2 and 5 times.

20. The process described in claim 15 wherein said final thickness is between about 500 and 2,000 Angstroms.

21. The process described in claim 15 wherein said period of time is between about 5 and 20 seconds.

22. The process described in claim 15 further comprising, prior to depositing any layer, determining, through simulation, composition, thickness, and the effects of surface treatment for each layer of said final stack.

* * * * *